(12) United States Patent
Herman et al.

(10) Patent No.: US 8,848,383 B2
(45) Date of Patent: Sep. 30, 2014

(54) MOTHERBOARD WITH CARD GUIDE CUTOUTS

(75) Inventors: Pinchas Herman, Sunnyvale, CA (US);
Radoslav Danilak, Cupertino, CA (US)

(73) Assignee: Skyera, Inc., San Jose, CA (US)

( * ) Notice: Subject to any disclaimer, the term of this patent is extended or adjusted under 35 U.S.C. 154(b) by 192 days.

(21) Appl. No.: 13/597,051

(22) Filed: Aug. 28, 2012

(65) Prior Publication Data

US 2014/0063722 A1 Mar. 6, 2014

(51) Int. Cl.
*H05K 7/14* (2006.01)
*H05K 7/12* (2006.01)

(52) U.S. Cl.
USPC .......................................................... 361/760

(58) Field of Classification Search
USPC .................. 361/760, 788, 784, 785, 92, 792, 361/679.32, 737
See application file for complete search history.

(56) References Cited

U.S. PATENT DOCUMENTS 8,040,683 B2 * 10/2011 Karabatsos ................... 361/785
8,234,459 B2 7/2012 Gaither et al.
8,514,584 B2 * 8/2013 Liang et al. ................... 361/785
2004/0003069 A1 1/2004 Wong
2008/0080152 A1 * 4/2008 Duppong et al. ............. 361/760
2010/0332733 A1 12/2010 Suzuki
2013/0100627 A1 * 4/2013 Cong et al. ................... 361/785
2013/0183913 A1 * 7/2013 Tevell et al. ................. 455/90.3

OTHER PUBLICATIONS

Non-Final Office for U.S. Appl. No. 13/596,979 mailed on Jul. 15, 2014. 8 pages.

* cited by examiner

*Primary Examiner* — Jenny L Wagner
*Assistant Examiner* — Michael P McFadden
(74) *Attorney, Agent, or Firm* — Kilpatrick Townsend & Stockton LLP

(57) ABSTRACT

A system for mounting a flash blade in a storage system includes a motherboard with a series of card guide cutouts for aligning flash blades. A flash blade can be aligned perpendicular to the motherboard and aligned parallel to adjacent flash blades by inserting the flash blade into one of the card guide cutouts and connecting the flash blade to a connector at one end of the cutout. This beneficially aligns the flash blade while making efficient use of the available vertical space within a chassis. The flash blade can also extend through the cutout to the other side of the motherboard. The efficient use of vertical space enables an increase in the number of solid state memory can be added to the flash blade relative to conventional designs, thereby improving capacity.

16 Claims, 4 Drawing Sheets

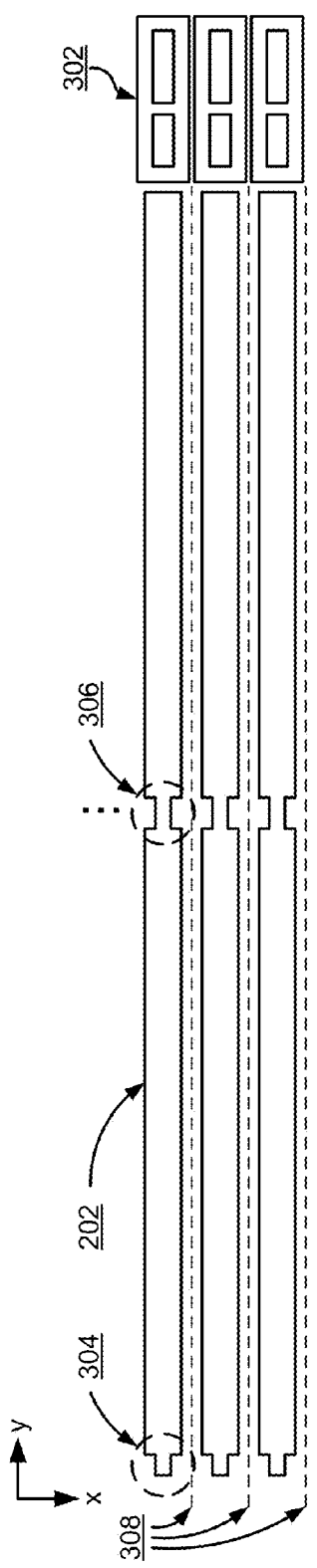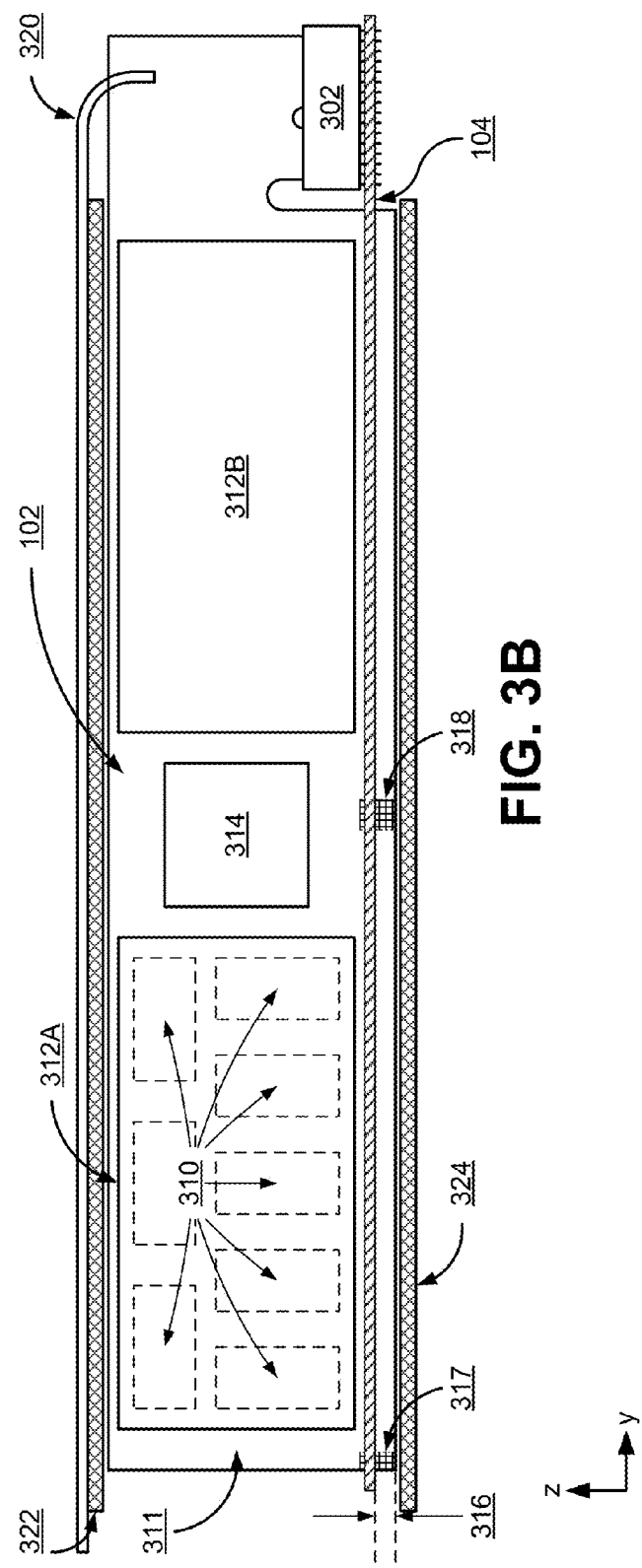

MOTHERBOARD WITH CARD GUIDE CUTOUTS

RELATED APPLICATIONS

This application is related to U.S. application Ser. No. 13/597,110 entitled "Chassis with Separate Thermal Chamber for Solid State Memory" to Pinchas Herman, et al. filed on Aug. 28, 2012, and to U.S. application Ser. No. 13/596,979 entitled "Integrated Storage and Switching for Memory Systems" to Radoslav Danilak filed on Aug. 28, 2012, the contents of which are each incorporated by reference herein.

BACKGROUND

1. Field of the Invention

The invention relates generally to mechanical mounting systems for electronic components and more particularly to mounting a printed circuit boards to a motherboard.

2. Description of the Related Arts

Conventionally, mechanical card guides are used to align a printed circuit board (PCB) when the PCB is being mounted perpendicular to a motherboard. Standalone mechanical card guides protrude significantly from the motherboard, and their large size makes them undesirable in many applications. Some board-mounted connectors, such as connectors for random access memory, may function as card guides for wider and shorter PCBs, but these connectors must be as long as the wider dimension of the PCB in order to properly align the PCB. In addition, these connectors must extend a significant height above the surface of the motherboard in order to effectively hold the PCB perpendicular to the motherboard. In a chassis with a substantially flat shape (e.g., a 1U form factor), a tall connector significantly reduces the amount of vertical space that is available for the PCB.

SUMMARY

A network storage system with solid state memory includes a motherboard, a connector, and a flash blade. The motherboard has a card guide cutout for aligning the flash blade. The card guide cutout has an elongated shape with two ends. The connector is mounted on the top surface of the motherboard adjacent to one end of the card guide cutouts. The connector secures the flash blade to the motherboard in a direction substantially perpendicular to the motherboard and connects the flash blade to electronic components on the motherboard. The flash blade contains one or more solid state memory devices and is secured to the connector on the top surface of the motherboard. A portion of the flash blade extends into the card guide cutout to align the flash blade with the card guide cutout. In some embodiments, the flash blade extends through the card guide cutout and into a region below the bottom surface of the motherboard.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments described herein can be readily understood by considering the following detailed description in conjunction with the accompanying drawings.

FIG. 3A is a top-down view of the card guide cutouts for flash blades, according to one embodiment.

FIG. 3B is a side view of a flash blade mounted in a card guide cutout, according to one embodiment.

DETAILED DESCRIPTION OF EMBODIMENTS

The teachings of the embodiments of the present invention can be readily understood by considering the following detailed description in conjunction with the accompanying drawings.

Reference in the specification to "one embodiment" or to "an embodiment" means that a particular feature, structure, or characteristic described in connection with the embodiments is included in at least one embodiment. The appearances of the phrase "in one embodiment" or "an embodiment" in various places in the specification are not necessarily all referring to the same embodiment.

Reference to this particular hardware is for exemplary purposes only and the scope of the invention is not limited to this particular component.

As used herein, the term "substantially" or "approximately" as applied to metrics such as length, area, volume, form factor, orientation (e.g., perpendicular or parallel), etc. means that the metric does not necessarily precisely conform to the stated value, but rather the metric may vary within a reasonable range to achieve substantial conformance as will be understood to those of ordinary skill in the art. Furthermore, the terms "perpendicular" or "parallel" used in isolation are generally inclusive of "substantially perpendicular" or "substantially parallel." For example, in one embodiment, "substantially perpendicular" means that the element is within a tolerance range (e.g., 3 degrees, 5 degrees, 10 degrees, etc.) of true perpendicular. Similarly, in one embodiment, "substantially parallel" means that the element is within a tolerance range (e.g., 3 degrees, 5 degrees, 10 degrees, etc.) of true parallel.

Furthermore, the language used in the specification has been principally selected for readability and instructional purposes, and may not have been selected to delineate or circumscribe the inventive subject matter. Accordingly, the disclosure of the embodiments is intended to be illustrative, but not limiting, of the scope of the embodiments.

A system for mounting flash blades in a storage system includes a motherboard with a series of card guide cutouts for aligning the flash blades. A flash blade can be aligned substantially perpendicular to the motherboard and aligned substantially parallel to adjacent flash blades by inserting the flash blade into one of the card guide cutouts and connecting the flash blade to a connector at one end of the cutout. This beneficially aligns the flash blade without occupying any additional vertical space. The flash blade can also extend through the cutout from the top side to the bottom side of the motherboard. Thus, the flash blade can comprise a printed circuit board that is substantially taller than those suitable for use with traditional surface-mounted card guides. As a result, the described motherboard and flash blade design allow more solid state memory components to be included on the flash blade relative to traditional designs.

Figure 1:
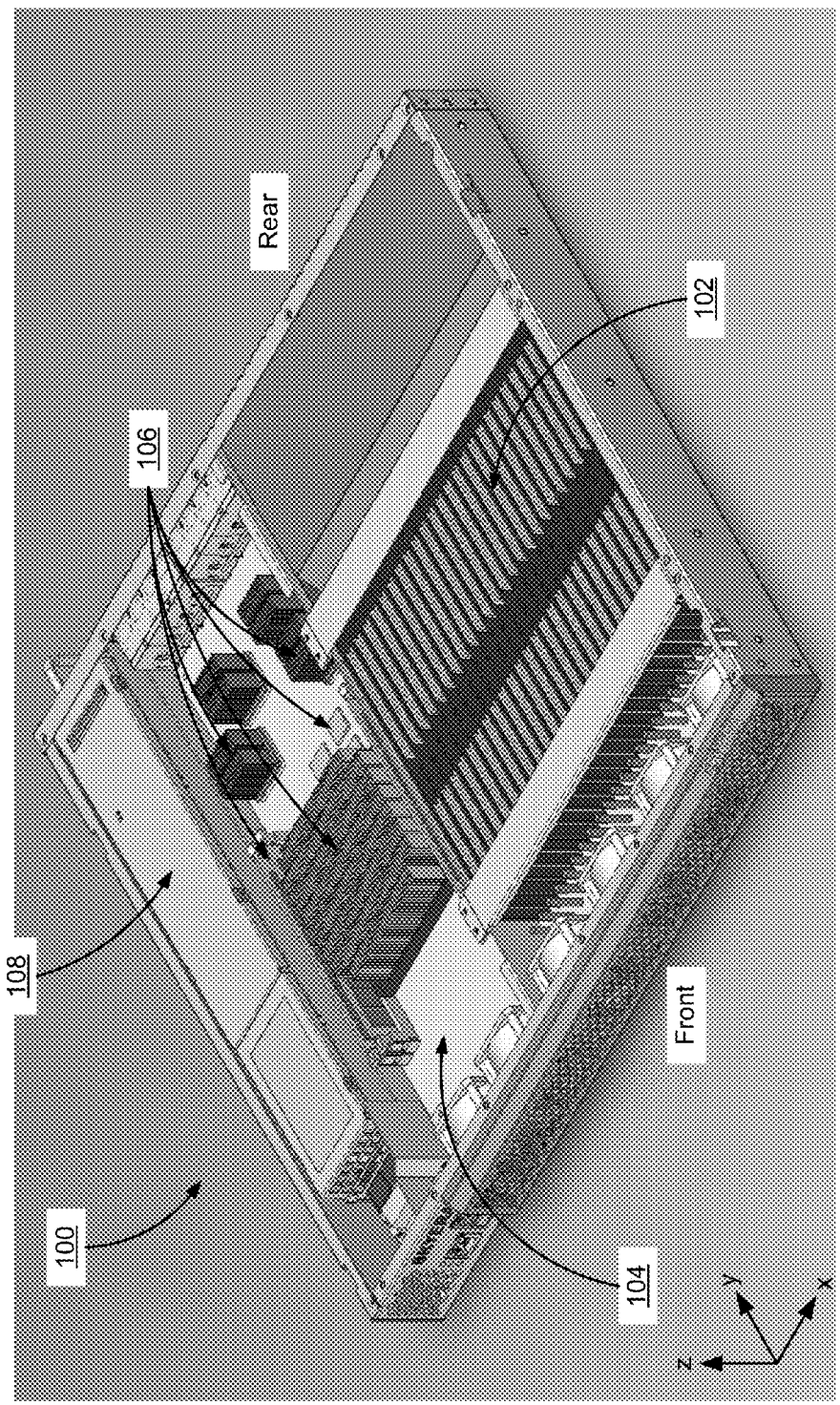
FIG. 1 is a perspective view of a storage system containing a motherboard with card guide cutouts, according to one embodiment.

FIG. 1 is a perspective view of an embodiment of a storage system containing a motherboard with card guide cutouts. FIG. 1 is illustrated with respect to x-y-z axes, which are used consistently throughout the figures in order to show how the views in the remaining figures are oriented with respect to FIG. 1. In the embodiment illustrated in FIG. 1, the storage system is housed in a chassis 100 with a 1U (one rack-unit) form factor. Thus, the chassis has a substantially flat shape with a limited amount of vertical space. For example, a typical chassis 100 with a 1U form factor has a height of approximately 1.7 inches.

A plurality of flash blades 102 are mounted perpendicular (or substantially perpendicular) to a motherboard 104 that sits parallel (or substantially parallel) to the bottom of the chassis 100. Each flash blade 102 may include, for example, a printed circuit board having one or more flash memory controllers and one or more solid state memory modules.

The storage system also includes a plurality of electronic components 106 mounted on the motherboard 104. The electronic components 106 perform functions associated with reading data from and writing data to the solid state memory modules in the flash blades 102. The electronic components 106 may also perform other general computing functions, such as, for example, executing networking and/or storage management applications. In particular, the electronic components 106 may include, for example, one or more processors and/or controllers, random access memory (RAM), and a network interface device. Some of the components (e.g., a processor or other high power components) may be positioned under heat sinks that help dissipate the heat generated by these components.

A power supply 108 receives electrical power from an external source (e.g., alternating current from a wall outlet) and outputs regulated power in a form more suitable for the flash blades 102 and the electronic components 106 (e.g., direct current).

As a whole, the storage system can be used for a wide range of computing tasks. However, the storage system is particularly useful as a high-speed networked storage system that provides connected computing devices with access to data stored in the memory. For example, in one embodiment, the storage system can provide 40-50 terabytes of high speed solid state memory in a single chassis 100. Since the storage system shown in FIG. 1 is housed in a chassis 100 with a 1U form factor, it can be conveniently installed in a rack with other equipment (e.g., servers) that can be directly connected to the storage system to access the stored data.

Figure 2:
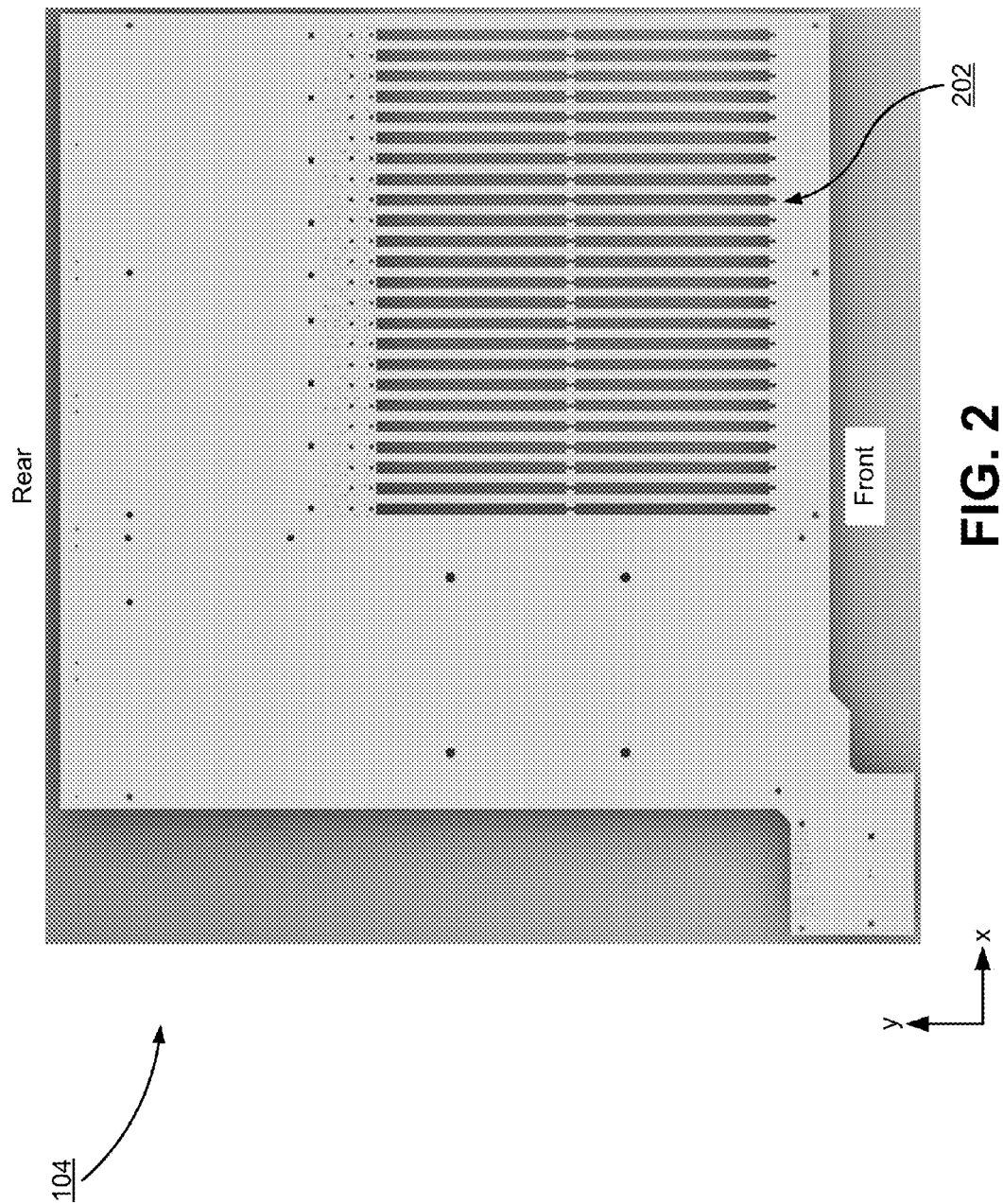
FIG. 2 is a top-down view of the motherboard in the chassis of FIG. 1, according to one embodiment.

FIG. 2 is a top-down view of the motherboard 104 in the chassis 100 of FIG. 1, according to one embodiment. The motherboard 104 includes a plurality of card guide cutouts 202 that align the flash blades 102 parallel to each other when inserted in the card guide cutouts perpendicular to the motherboard 104. Each card guide cutout 202 is an elongated slot-shaped area that is cut out of the motherboard 104. The motherboard 104 also includes a variety of holes for through-hole mounted electronic components 106 and conductive traces (not pictured) that carry electric signals between the electronic components 106 and between the electronic components 106 and connectors to the flash blades 102.

FIG. 3A is a top-down view of the card guide cutouts 202 for the flash blades 102, according to one embodiment. The view of FIG. 3A is rotated clockwise by 90° about the z-axis relative to FIG. 2. Thus, the y-axis (which pointed upward in FIG. 2) points to the right in FIG. 3A. For simplicity of illustration, only three cutouts 202 are illustrated in FIG. 3A. A connector 302 is mounted on the motherboard 104 adjacent to a first end of each card guide 202. In the top-down view shown in FIG. 3, the first end of each card guide 202 is on the right, and the connectors 302 are on the far right. Each connector 302 provides electrical power to the connected flash blade 102 and establishes data connectivity between the connected flash blade 102 and the components 106 on the motherboard 104.

In addition to providing power and data connectivity, each connector 302 provides structural support to hold the connected flash blade 102 substantially perpendicular to the motherboard 104.

In one embodiment, each card guide cutout 202 includes two guide points 304, 306. One guide point 304 is positioned at a second end (the left side in FIG. 3A) of the card guide cutout 202 opposite the connector 302 and another guide point 306 is positioned in a middle position of the cutout 202 between the first end and the second end. In alternative embodiments, fewer or additional guide points may be present and/or the guide points may be positioned differently. The guide points 304, 306 align with corresponding contact points on the flash blade 102 as will be described below with reference to FIG. 3B (see, e.g., contact points 317, 318). Together, the connector 302 and the two guide points 304, 306 anchor the position of the flash blade 102 at three locations to secure the flash blade to the motherboard 104 and to provide structural support that prevents the flash blade from warping or deforming. Warping and deformation may be caused by several different factors, including PCB process variation, unbalanced copper in internal layers of the flash blade, unbalanced components on the flash blade, and thermal stress.

In some embodiments, power units (not pictured) for the flash blades 102 are positioned adjacent to the second ends of the card guide cutouts 202. The power units convert a higher-voltage power source from the power supply 108 into lower voltages that are suitable for the flash blades 102. In one embodiment, the power units convert a 12-volt power source from the power supply 108 into a 3.3-volt source and a 1.8-volt source. Placing the power units adjacent to the second ends of the card guide cutouts 202 is beneficial in embodiments where the second ends of the cutouts 202 are near the front of the chassis 100, such as in the embodiment shown in FIGS. 1 and 2, because the power units are positioned close to cooling fans in the front of the chassis 100 and the wiring connecting the power supply 108 to the power units is less intrusive.

In these embodiments, the motherboard 104 may include conductive traces 308 positioned in the area between adjacent cutouts 202. For example, in one embodiment, traces 308 are oriented substantially parallel to the card guide cutouts 202, although this is not necessarily the case. These traces 308 carry power from the power units to the connectors 302, and the connectors 302 relay the power to the flash blades 102. In one embodiment, the traces 308 are embedded in one or more internal layers of the motherboard 104. Alternatively, the traces 308 may be placed on a surface layer of the motherboard 104.

FIG. 3B is a side view of a flash blade 102 mounted in a card guide cutout 202, according to one embodiment. As described above with reference to FIG. 1, the flash blade 102 includes a plurality of solid state memory modules mounted on a PCB 311. In one embodiment, the solid state memory modules are arranged into groups, and a first group 310 of memory modules is shown in FIG. 3B. The group 310 of memory modules may be covered with a heat spreader 312A to maintain the modules at approximately the same temperature and dissipate heat if necessary. The flash blade 102 may also include a second group of solid state modules (not pictured) covered by a second heat spreader 312B. The opposite surface (not viewable in FIG. 3B) of the flash blade 102 may include two additional groups of solid state memory modules (not pictured) covered by two additional heat spreaders (not pictured).

In addition, a flash controller 314 may be mounted on the PCB 311. The flash controller 314 manages data stored on the solid state memory modules (e.g., performs read, write, or erase operations) and transfers data between the solid state memory modules and electronic components 106 on the motherboard 104. In embodiments where the flash blade 102 contains memory modules on both surfaces, a second controller (not shown) may be added to the opposite surface to manage the data stored on the modules on the opposite surface. Alternatively, a single controller 308 may manage the data stored on the modules on both surfaces of the flash blade 102.

In the illustrated embodiment, the flash blade 102 extends through the card guide cutout 202 and a portion 316 of the flash blade extends into the space below the bottom side of the motherboard 104. Compared to a conventional full-length connector that forces a flash blade to be positioned entirely above the motherboard, the configuration shown in FIG. 3B beneficially allows the flash blade 102 to be taller and to make more efficient use of vertical space within the chassis 100. For example, in one embodiment, the card guide cutout 202 allows a flash blade 102 with a height of approximately 1.5 inches to be housed vertically in a 1U chassis that has vertical dimension of approximately 1.7 inches.

In an alternative embodiment, the flash blade 102 may simply extend into the card guide cutout 202 without extending into the space 316 below the motherboard 104. In this embodiment, the cutout 202 may still extend partially or entirely through the vertical thickness of the motherboard 104.

A first contact point 317 in the lower left corner of the flash blade 102 aligns with and makes contact with the guide point 304 on the second end of the card guide cutout 202. Meanwhile, a second contact point 318 positioned in the middle of the flash blade's bottom edge aligns with the guide point 306 in the middle of the cutout 202. In the embodiment shown in FIG. 3B, the contact points 317, 318 comprise areas on the flash blade 102 where no surface mount components are present, thus allowing the first guide point 304 to contact both surfaces of the PCB at the first contact point 317 to hold the flash blade 311 in place. In alternative embodiments, the first and second contact points 317, 318 may include a structural feature of the flash blade 102 (e.g., an indentation in the PCB) that mechanically secures the flash blade 102 to one of the guide points 304, 306.

As described above with reference to FIG. 3A, the connector 302, guide points 304, 306, and contact points 317, 318 anchor the position at three locations to prevent the flash blade 102 from warping or deforming while it is mounted in the card guide cutout 202.

A flash blade cover 320 may optionally be placed on top of the plurality of flash blades 102 to further secure the flash blades 102. The bottom surface of the flash blade cover 320 may be covered with a sheet of compressible material 322 (e.g., a foam) that contacts with and presses down against the top edges of the flash blades 102. By pressing down on the flash blades 102, the compressible sheet 322 beneficially prevents the flash blades 102 from rotating relative to the motherboard 104 (i.e., the compressible sheet 322 maintains the flash blades 102 in an orientation substantially perpendicular to the motherboard 104). The compressible sheet 322 is also beneficial because it can make contact with all of the flash blades 102 even when there is some variation in the heights of individual flash blades 102 (e.g., due to manufacturing tolerances and process variation in the flash blades 102 themselves, the cutouts 202, and/or the connectors 302).

To further prevent the flash blades 102 from rotating relative to the motherboard 104, a side of the flash blade cover 320 may feature a comb pattern that curves downward to engage the flash blades 102. In the embodiment illustrated in FIG. 3B, the downward curve of the comb pattern engages the flash blades 102 in the region above the connector 302. However, the downward curve may engage the flash blades 102 in a different region in alternate embodiments. The shape of the comb pattern is described in additional detail with reference to FIG. 4.

A second sheet of compressible material 324 may be added at the bottom of the chassis 100 to contact with and press upward against the bottom edges of the flash blades 102. In embodiments where the flash blades extend below the motherboard 104, the second compressible sheet prevents bottom edges of the flash blades 102 from shifting relative to each other. In embodiments that include both compressible sheets 322, 324, the flash blades 102 are pressed between the two compressible sheets 322, 324 to provide an especially high level of stability.

The compressible sheets 322, 324 may be made of any compressible material, such as rubber or foam. However, an insulating material (e.g., foam) is particularly well-suited for use as the compressible sheets 322, 324 because it may be desirable to thermally insulate the flash blades 102 in some embodiments. The sheets 322, 324 furthermore ensure electrical isolation between the flash blades 202 and potentially conducting components of the chassis 100.

Figure 4:
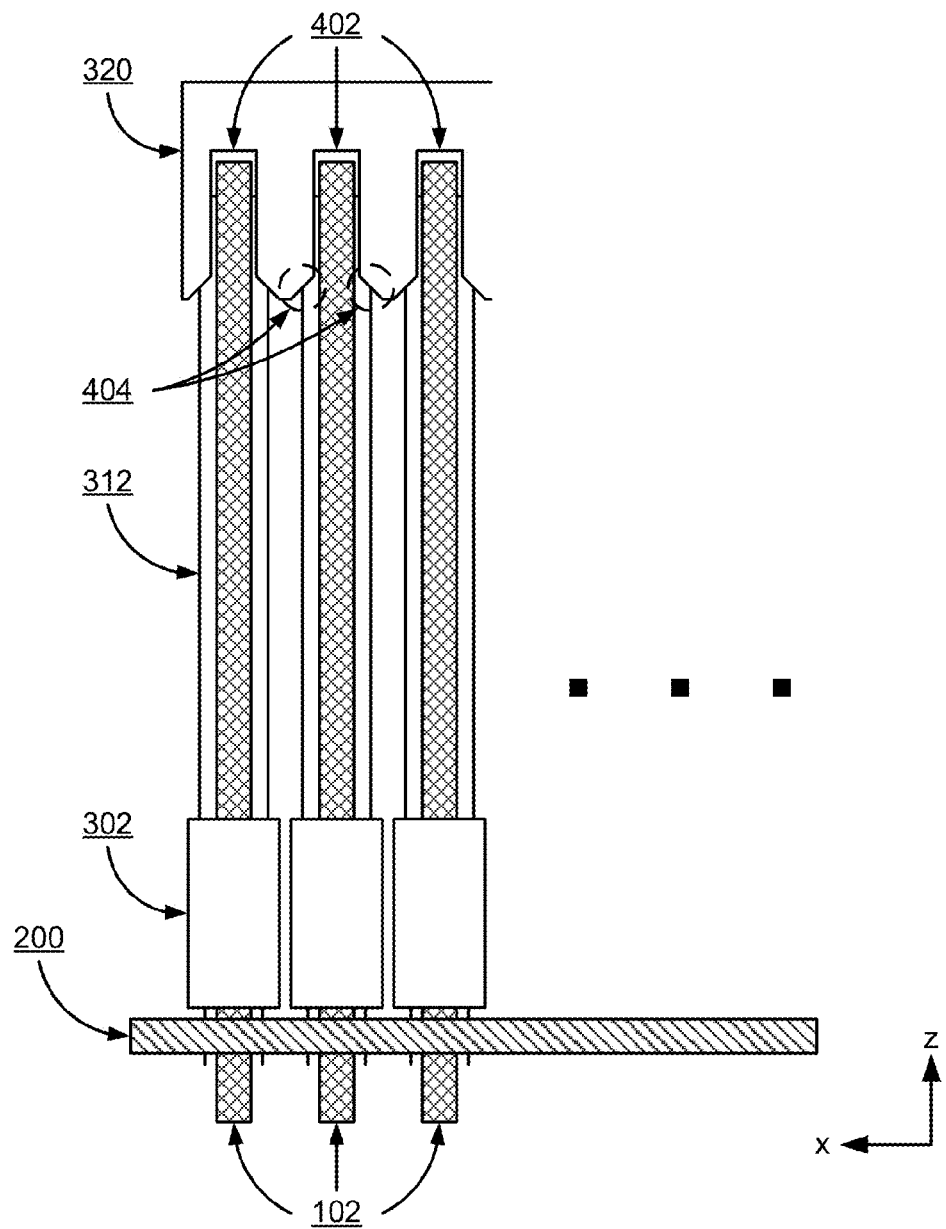
FIG. 4 is a front view of flash blades mounted in card guide cutouts and secured with a flash blade cover, according to one embodiment.

FIG. 4 is a front view of three flash blades 102 mounted in card guide cutouts 202 and secured with a flash blade cover 320, according to one embodiment. As used herein, the front of the flash blades 102 is the end shown on the right in FIG. 3B and the view in FIG. 4 is rotated 90 degrees about the z-axis relative to the view in FIG. 3B. Thus, the connectors 302 and the downward curve of the flash blade cover 320 can be seen in the foreground, and the heat spreaders 312 mounted on both sides of the flash blades 102 can be seen in the background.

As described above with reference to FIG. 3B, a comb pattern may be cut into the curved side of the flash blade cover 320 (the right side in FIG. 3B). The comb pattern features a plurality of slots 402, each of which supports a flash blade 102 on both of the flash blade's sides. After the flash blades 102 are secured to the connectors 302 and guide points 304, 306, the cover 320 is installed by lowering the comb pattern down onto the flash blades 102. The opening of each slot 404 contains two chamfered corners 404, which automatically adjusts any flash blades 102 that were misaligned (e.g., not substantially perpendicular to the motherboard) by guiding the flash blades 102 into the slots 402. In one embodiment, the comb pattern extends 0.25 inches below the tops of the flash blades 102 after the flash blade cover 320 is lowered into position.

The flash blade cover 320 can be secured within the chassis 100 so that the cover 320 remains in place when the top of the chassis 100 is removed (e.g., when a user is performing maintenance or replacing other components 106 inside the chassis). As a result, the comb pattern remains engaged and the flash blades 102 remain pressed between the two compressible sheets, thus maintaining the stability and orientation of the flash blades 102 as other components 106 are being serviced.

Embodiments of the present invention are not limited to the example embodiments described above. For example, in other embodiments, a motherboard with card guide cutouts may be housed in a chassis with a different form factor. Alternatively, a different type of printed circuit board may include card guide cutouts for mounting flash blades. For example, a different embodiment of a storage system may include a motherboard connected via a high-speed bus to a dedicated PCB with card guide cutouts for mounting flash blades. Card guide cutouts may also be used for mounting other types of electronic components, such as random access memory (RAM) or graphics cards. In addition, the underlying principles described herein may be applied to various other hardware components, including those not presently available.

The features and advantages described in the specification are not all inclusive and, in particular, many additional features and advantages will be apparent to one of ordinary skill in the art in view of the drawings and specification. Moreover, it should be noted that the language used in the specification has been principally selected for readability and instructional purposes, and may not have been selected to delineate or circumscribe the inventive subject matter.

The invention claimed is:

1. A network storage system, comprising:
   a motherboard, having a top surface and a bottom surface, and further having a plurality of card guide cutouts for aligning a plurality of flash blades, the card guide cutouts oriented substantially parallel to each other, having an elongated shape extending in a first direction, and further having a first end and a second end;
   one or more electronic components mounted on the motherboard and configured to perform functions associated with interfacing the plurality of flash blades to one or more external computing devices;
   a plurality of connectors, each connector mounted on the top surface of the motherboard adjacent to the first end of one of the card guide cutouts, the plurality of connectors securing the flash blades to the motherboard in an orientation substantially perpendicular to the motherboard, and the plurality of connectors communicatively coupling the flash blades to the electronic components; and
   the plurality of flash blades, each flash blade having one or more solid state memory devices mounted thereon, the flash blades secured to the connectors on the top surface of the motherboard and a portion of each flash blade extending into one of the card guide cutouts of the motherboard to align the flash blade with the card guide cutout.

2. The network storage system of claim 1, further comprising:
   one or more power units mounted on the motherboard and positioned adjacent to the second ends of the card guide cutouts, the power units supplying power to the flash blades; and
   a plurality of conductive traces on the motherboard for supplying power from the power units to the connectors, the conductive traces positioned on the motherboard between adjacent card guide cutouts.

3. The network storage system of claim 1, wherein a portion of each flash blade extends through the card guide cutout and below the bottom side of the motherboard.

4. The network storage system of claim 1, wherein each card guide cutout comprises:
   a first guide point at the second end of the card guide cutout for aligning with a first contact point on the flash blade; and
   a second guide point between the second end and the first end of the card guide cutout for aligning with a second contact point on the flash blade.

5. The network storage system of claim 1, further comprising a flash blade cover for the plurality of flash blades, the flash blade cover positioned on top of the plurality of flash blades to prevent the flash blades from rotating relative to the motherboard.

6. The network storage system of claim 5, wherein a bottom surface of the flash blade cover is lined with a compressible liner sheet, the compressible liner sheet contacting with a side of each flash blade.

7. The network storage system of claim 5, wherein a side of the flash blade cover has a comb pattern, the comb pattern comprising a plurality of slots and pairs of chamfered corners positioned at the opening of each slot, each pair of chamfered corners for guiding one of the flash blades into the corresponding slot.

8. The network storage system of claim 1, further comprising a chassis, wherein the motherboard and the electronic components are housed within the chassis, the motherboard oriented substantially parallel to a bottom plate of the chassis.

9. An apparatus, comprising:
   a motherboard, having a top surface and a bottom surface, and further having a card guide cutout for aligning a flash blade, the card guide cutout having an elongated shape extending in a first direction, and further having a first end and a second end;
   a connector, mounted on the top side of the motherboard adjacent to the first end of the card guide cutout, the connector securing the flash blade to the motherboard in an orientation substantially perpendicular to the motherboard and the connector communicatively coupling the flash blade to an electronic component mounted on the motherboard; and
   the flash blade, having one or more one solid state memory devices mounted therein, the flash blade secured to the connector on the top side of the motherboard and a portion of the flash blade extending into the card guide cutout of the motherboard to align the flash blade with the card guide cutout.

10. The apparatus of claim 9, further comprising:
    a power unit mounted on the motherboard and positioned adjacent to the second end of the card guide cutout, the power unit supplying power to the flash blade; and
    a conductive trace on the motherboard for supplying power from the power unit to the connector, the conductive trace positioned on the motherboard parallel to the card guide cutout in the first direction.

11. The apparatus of claim 9, wherein a portion of the flash blade extends through the card guide cutout and below the bottom side of the motherboard.

12. The apparatus of claim 9, wherein the card guide cutout comprises:
    a first guide point at the second end of the card guide cutout for aligning with a first contact point on the flash blade; and
    a second guide point between the second end and the first end of the card guide cutout for aligning with a second contact point on the flash blade.

13. The apparatus of claim 9, further comprising a chassis, wherein the motherboard is housed within the chassis, the motherboard oriented substantially parallel to a bottom plate of the chassis.

14. A printed circuit board (PCB) assembly, comprising:
a first PCB, having a top surface and a bottom surface, and further having at least one electronic component mounted thereon;
a card guide cutout comprising a removed area of the PCB, the card guide cutout having an elongated shape extending in a first direction, having a first end and a second end; and
a connector, mounted on the top side of the first PCB adjacent to the first end of the card guide cutout, the connector for securing the second PCB to the motherboard in an orientation substantially perpendicular to the first PCB.

15. The PCB assembly of claim 14, further comprising:
a power unit mounted on the motherboard and positioned adjacent to the second end of the card guide cutout, the power unit supplying power to the second PCB; and
a conductive trace on the motherboard for supplying power from the power unit to the connector, the conductive trace positioned on the first PCB parallel to the card guide cutout in the first direction.

16. The PCB assembly of claim 14, wherein the card guide cutout comprises:
a first guide point at the second end of the card guide cutout for aligning with a first contact point on the flash blade; and
a second guide point between the second end and the first end of the card guide cutout for aligning with a second contact point on the flash blade.

\* \* \* \* \*